(12) United States Patent
Kim

(10) Patent No.: US 7,923,326 B2
(45) Date of Patent: Apr. 12, 2011

(54) MEMORY DEVICE AND METHOD FOR MANUFACTURING THE SAME

(75) Inventor: Heung Jin Kim, Choongcheongbuk-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 12/548,988

(22) Filed: Aug. 27, 2009

(65) Prior Publication Data

US 2009/0317952 A1 Dec. 24, 2009

Related U.S. Application Data

(62) Division of application No. 11/319,912, filed on Dec. 27, 2005, now Pat. No. 7,598,563.

(30) Foreign Application Priority Data

Dec. 31, 2004 (KR) .................. 10-2004-0118276

(51) Int. Cl.
*H01L 21/336* (2006.01)
(52) U.S. Cl. ........ 438/259; 438/264; 438/589; 438/594; 257/E21.422; 257/E21.692
(58) Field of Classification Search .................. 438/259, 438/264, 589, 594; 257/E21.422, E21.692
See application file for complete search history.

(56) References Cited

U.S. PATENT DOCUMENTS

| | | |
|---|---|---|
| 4,727,046 A | 2/1988 | Tuntasood et al. |
| 5,943,267 A | 8/1999 | Sekariapuram et al. |
| 6,130,453 A | 10/2000 | Mei et al. |
| 6,191,002 B1 * | 2/2001 | Koyanagi .................. 438/431 |
| 6,429,075 B2 | 8/2002 | Yeh et al. |
| 6,720,219 B2 | 4/2004 | Huang |
| 6,756,633 B2 | 6/2004 | Wang et al. |
| 6,818,948 B2 | 11/2004 | Lin |

(Continued)

FOREIGN PATENT DOCUMENTS

| | | |
|---|---|---|
| JP | 1-291470 A | 11/1989 |
| WO | 2004/057661 A2 | 7/2004 |

OTHER PUBLICATIONS

Hideki Motoshiro, Hideaki Arima, Yuichi Nakajima, Kojiro Yuzuriha, Yoshiki Okumura and Ikuo Ogawa; "Semiconductor Device"; Patent Abstracts of Japan; Publication No. 01291470 A; Publication Date: Nov. 24, 1989; Japanese Patent Office, Japan.
German Office Action dated Jun. 30, 2009; German Patent Application No. 10 205 061 199.0-33, filed Dec. 21, 2005; German Patent and Trade Mark Office (DPMA), Germany.

*Primary Examiner* — Mary Wilczewski
*Assistant Examiner* — Toniae M Thomas
(74) *Attorney, Agent, or Firm* — The Law Offices of Andrew D. Fortney; Andrew D. Fortney; William K. Nelson

(57) ABSTRACT

A split gate (flash) EEPROM cell and a method for manufacturing the same is disclosed, in which a control gate and a floating gate are formed in a vertical structure, to minimize a size of the cell, to obtain a high coupling ratio, and to lower a programming voltage. The split gate EEPROM cell includes a semiconductor substrate having a trench; a tunneling oxide layer at sidewalls of the trench; a floating gate, a dielectric layer and a control gate in sequence on the tunneling oxide layer; a buffer dielectric layer at sidewalls of the floating gate and the control gate; a source junction in the semiconductor substrate at the bottom surface of the trench; a source electrode in the trench between opposing buffer dielectric layers, electrically connected to the source junction; and a drain junction on the surface of the semiconductor substrate outside the trench.

7 Claims, 9 Drawing Sheets

U.S. PATENT DOCUMENTS

| | | | |
|---|---|---|---|
| 6,846,713 B1 * | 1/2005 | Lee | 438/259 |
| 2004/0253787 A1 | 12/2004 | Lee et al. | |
| 2006/0220093 A1 | 10/2006 | Van Schaijk et al. | |
| 2009/0317953 A1 * | 12/2009 | Kim | 438/264 |

* cited by examiner

MEMORY DEVICE AND METHOD FOR MANUFACTURING THE SAME

This application is a divisional of U.S. patent application Ser. No. 11/319,912, filed Dec. 27, 2005 now U.S. Pat. No. 7,598,563, which claims the benefit of Korean Application No. P2004-118276, filed on Dec. 31, 2004, each of which is hereby incorporated herein by reference in its entirety.

BACKGROUND OF THE INVENTION

1. Field of the Invention

The present invention relates to a memory device, and more particularly, to a Split Gate (Flash) Electrically Erasable Programmable Read Only Memory (EEPROM) and a method for manufacturing the same.

2. Discussion of the Related Art

A typical example of a nonvolatile memory device, which has electric program and erase functions, is a (flash) EEPROM (Electrically Erasable Programmable Read Only Memory) cell. Such (flash) EEPROM cells may be classified into a stack structure and a split gate structure.

FIG. 1 shows a cross sectional view of a stack type EEPROM cell according to the related art. FIG. 2 shows a cross sectional view of a split gate type EEPROM cell according to the related art.

As shown in FIG. 1, the stack type EEPROM cell according to the related art includes a p-type semiconductor substrate 1, a tunneling oxide layer 2, a floating gate 3, an inter-poly oxide layer 4, and a control gate 5 formed in sequence. Also, source and drain regions 6 and 7 are formed at opposed sides of the floating gate 3 and the control gate 5 in the p-type semiconductor substrate 1 by implantation of, e.g., n-type impurity ions.

In case of the stack type EEPROM cell, the floating gate 3 and the control gate 5 are stacked on the p-type semiconductor substrate 1. In this case, even though an area of the cell is relatively small, it may have a problem in that the erase function of the cell can be excessive. In such an excessive erase problem, the cell threshold may be shifted after many repeated write/erase cycles. In order to overcome the problem of the excessive erase function, the split gate type EEPROM cell has been proposed.

As shown in FIG. 2, a split gate type EEPROM cell according to the related art, a tunneling oxide layer 2 may be formed on a p-type semiconductor substrate 1, and a floating gate 3 is generally formed on a predetermined portion of the tunneling oxide layer 2. Then, an inter-poly oxide layer 4 is generally formed on the floating gate 3, and a select gate oxide layer 8 is formed at one side of the floating gate 3 on the p-type semiconductor substrate 1. After that, a control gate 5 may be formed on the inter-poly oxide layer 4 and the select gate oxide layer 8, where the inter-poly oxide layer 4 may be formed as one body (e.g., may be unitary) with the select gate oxide layer 8. Then, source and drain regions 6 and 7 are generally formed at opposed sides of the floating gate 3 and the control gate 5 in the (p-type) semiconductor substrate 1 by implantation of a high concentration or doping level of n-type impurity ions.

Accordingly, the split gate design makes it possible to solve the problem of the excessive erase function of the cell. However, the control gate 5 is formed not only on the floating gate 3 but also over the p-type semiconductor substrate 1, so that it can be difficult to decrease the area of the cell (or make it about the same size as the stacked gate structure). As a result, it may be difficult to satisfy the trend toward high integration in semiconductor devices containing EEPROM cells, particularly flash EEPROM cells.

In the related art split gate type (flash) EEPROM cell, a channel length of the control gate is generally formed or determined by an overlay control of photolithography. As a result, a threshold voltage and/or a cell current may be changed during operation of the cell. Also, since the control gate is formed along the surface of a wafer, it is highly desirable to consider overlay margins during scaling.

SUMMARY OF THE INVENTION

Accordingly, the present invention is directed to a split gate flash EEPROM cell and a method for manufacturing the same that substantially obviates one or more problems due to limitations and disadvantages of the related art.

An object of the present invention is to provide a split gate (flash) EEPROM cell and a method for manufacturing the same, in which a control gate and a floating gate have a vertical structure (e.g., a height greater than the width), to minimize the cell size and/or to obtain a high coupling ratio, thereby lowering a programming voltage.

Additional advantages, objects, and features of the invention will be set forth at least in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a memory device may include a semiconductor substrate having a trench; a tunneling oxide layer at sidewalls of the trench; a floating gate, a dielectric layer and a control gate, in order, on the tunneling oxide layer at sidewalls of the trench; a buffer dielectric layer at sidewalls of the floating gate and the control gate; a source junction on the semiconductor substrate of the bottom surface of the trench; a source electrode in the trench between the buffer dielectric layers, electrically connected to the source junction; and a drain junction on the surface of the semiconductor substrate outside the trench.

The upper surface of the floating gate may have a hollow part or indentation (generally, a topography with a lower portion, but generally referred to herein as an indentation), and the lower surface of the control gate may have a complementary protrusion, generally corresponding to the floating gate indentation. Also, the source and drain junctions may contain different impurity ions having the same conductivity type. Furthermore, the floating gate and the control gate may overlap each other along their sides (e.g., the vertical axis). Also, in an exemplary embodiment, the present split gate EEPROM cell is capable of storing two bits of data per cell.

In another aspect, a method for manufacturing a memory device may include steps of depositing an insulating layer on a semiconductor substrate; forming a first trench by etching the insulating layer and the semiconductor substrate to a predetermined depth; forming a tunneling oxide layer in the first trench; forming a floating gate layer on the tunneling oxide layer inside the first trench; forming a dielectric layer on the floating gate layer; forming a control gate layer in the first trench of the dielectric layer; forming an oxide layer on the surface of the control gate layer; forming a second trench by removing central portions of the oxide layer, the control gate layer, the dielectric layer, the floating gate layer and the tunneling oxide layer in the trench; forming a buffer dielectric layer on a sidewall of the second trench; forming a source junction by implanting impurity ions into the semiconductor substrate below the second trench; forming a source electrode in the second trench, electrically connected to the source junction; and forming a drain junction by implanting impurity ions into areas of the semiconductor substrate from which the insulating layer is removed (more generally, exposed areas of the semiconductor substrate).

The source and drain junctions may be formed by implanting different impurity ions having the same conductivity type (i.e., forming source junctions may comprise implanting a first impurity ion of a first conductivity type, and forming drain junctions may comprise implanting a second impurity ion of the first conductivity type, but different from the first impurity ion).

In another aspect, a method for manufacturing a memory device may include depositing an insulating layer on a semiconductor substrate; forming a first trench by etching the insulating layer and the semiconductor substrate to a predetermined depth; forming a tunneling oxide layer in the trench; forming a floating gate layer on the tunneling oxide layer in the first trench; forming a hollow part, indentation or depression (more generally, "indentation") by etching a central portion of the floating gate layer to a predetermined depth; forming a dielectric layer on the floating gate layer; forming a control gate layer in the first trench on the dielectric layer; forming an oxide layer on the control gate layer; forming a second trench by removing central portions of the oxide layer, the control gate layer, the dielectric layer, the floating gate layer, and the tunneling oxide layer in the first trench; forming a buffer dielectric layer at a sidewall of the second trench; forming a source junction by implanting impurity ions into the semiconductor substrate below the second trench; forming a source electrode in the second trench, electrically connected to the source junction; and forming a drain junction by removing the insulating layer and implanting impurity ions into exposed areas of the semiconductor substrate, from which the insulating layer is removed (e.g., using the insulating layer as a mask).

The control gate layer may be formed in (e.g., complementary to) the indentation in the floating gate layer, so that the floating gate layer overlaps with the control gate layer at a side part thereof (e.g., along a vertical axis of the cell).

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a memory device and a method for manufacturing the same according to the present invention will be described with reference to the accompanying drawings.

FIG. 3A to FIG. 3G are cross sectional views of the process for manufacturing a split gate flash EEPROM cell according to the first embodiment of the present invention.

Figure 1:
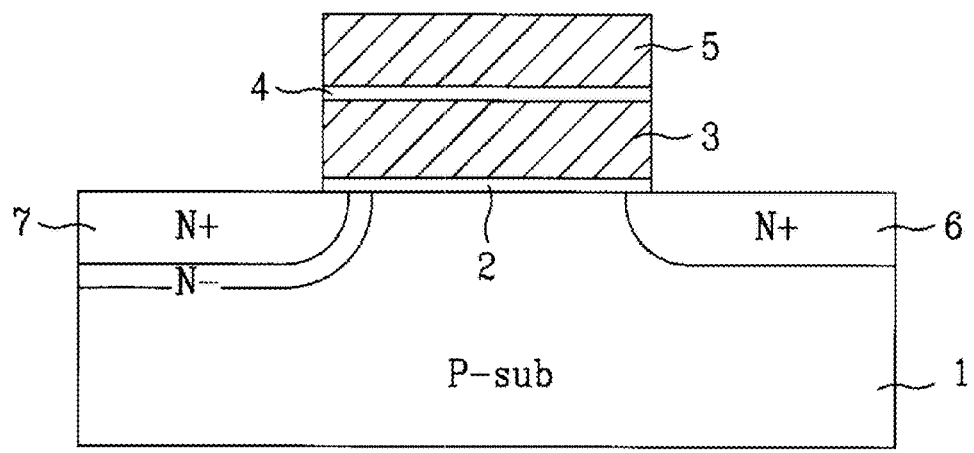
FIG. 1 is a cross-sectional view of a stack type flash EEPROM cell according to the related art.
Figure 2:
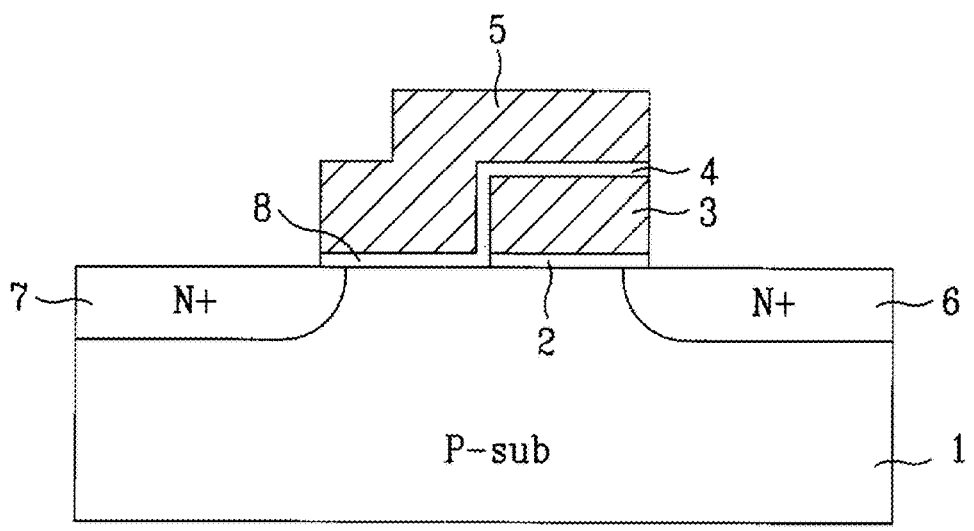
FIG. 2 is a cross-sectional view of a split gate flash EEPROM cell according to the related art.
Figure 3A:
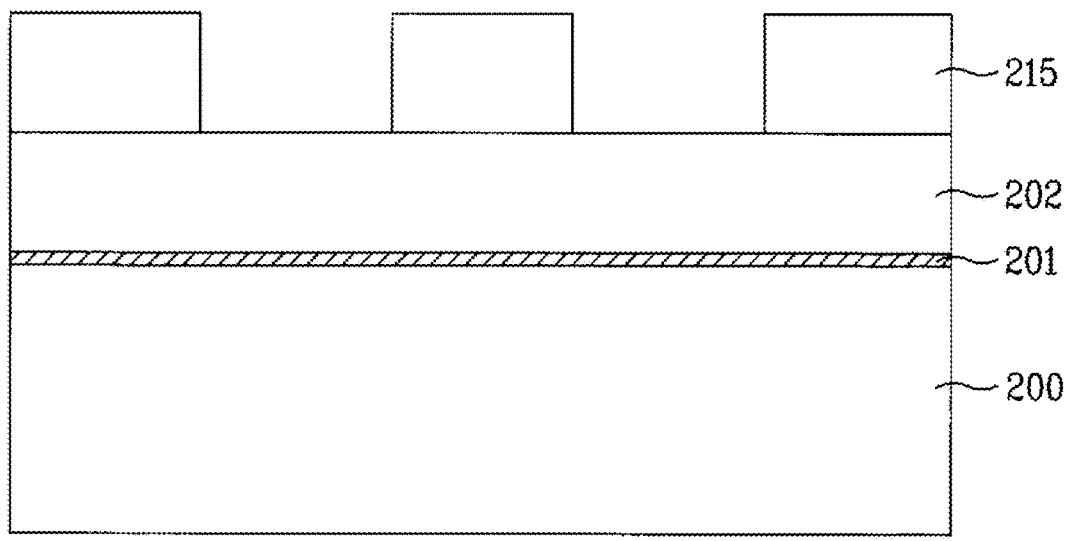
FIG. 3A to FIG. 3G are cross-sectional views of an exemplary process for manufacturing a split gate (flash) EEPROM cell according to a first embodiment of the present invention.

As shown in FIG. 3A, a semiconductor substrate 200 may have therein an active area and a field area, defined at least in part by a device isolation layer (not shown). Then, a buffer oxide (e.g., silicon dioxide) layer 201 and an insulating layer 202 are sequentially deposited on the semiconductor substrate 200. After that, a first photoresist 215 is coated on the insulating layer 202, and then the first photoresist 215 is patterned on the insulating layer 202 by a conventional photolithography (e.g., exposure and development) process. At this time, the insulating layer 202 may comprise a nitride layer (e.g., silicon nitride).

Figure 3B:
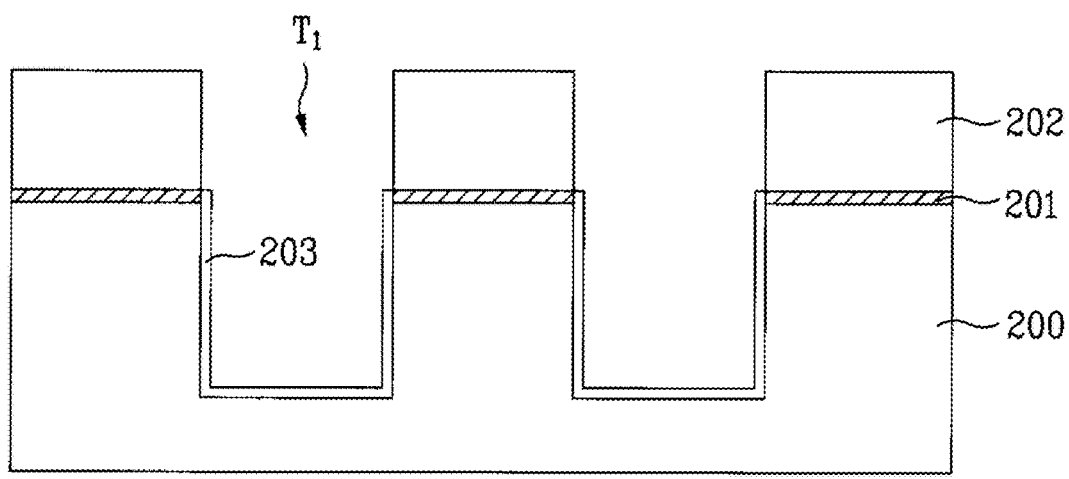

As shown in FIG. 3B, the insulating layer 202, the buffer oxide layer 201 and the semiconductor substrate 200 are etched to a predetermined depth (e.g., a trench depth) using the patterned first photoresist 215 as a mask, thereby forming a trench T1 in a cell region. Then, the semiconductor substrate 200 may be etched and/or cleaned by a clean active pit reactive ion etching method. After that, a tunneling oxide layer 203 is formed in a trench T1 of the semiconductor substrate 200, and then the first photoresist 215 is removed.

The tunneling oxide layer 203 may be formed by a chemical vapor deposition (CVD) process (such as plasma enhanced [PE]-CVD or high density plasma [HDP]-CVD, from silicon sources such as TEOS or silane [$SiH_4$], and oxygen sources such as ozone [$O_3$] or oxygen [$O_2$], as is known in the art) or a thermal oxidation process (which may be wet or dry). In the case of the CVD process, the tunneling oxide layer 203 is formed on an entire surface of the semiconductor substrate 200, including the insulating layer 202. On the other hand, in the case of the thermal oxidation process, the tunneling oxide layer 203 is formed generally only on the semiconductor substrate 200 in the trench T1. In FIG. 3B, the tunneling oxide layer 203 is formed by thermal oxidation.

Figure 3C:
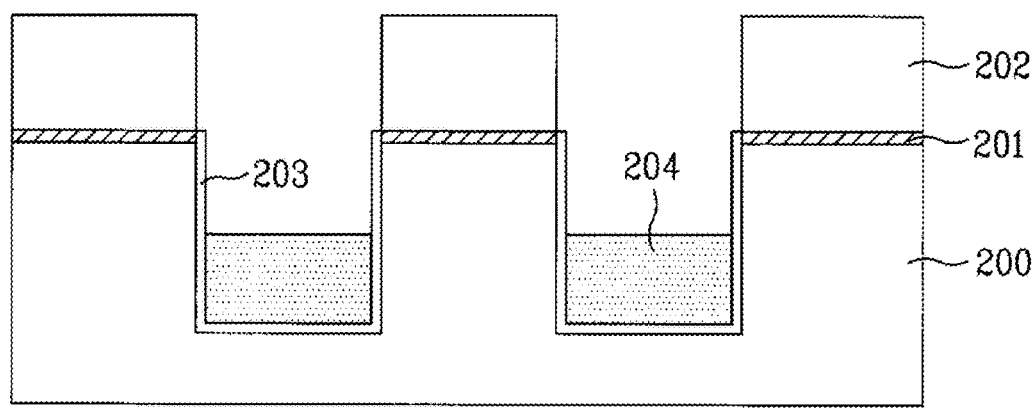

Referring to FIG. 3C, a conductive layer (e.g., comprising amorphous silicon, which may be later converted to polysilicon) is deposited on the entire surface of the semiconductor substrate 200 including the trench T1. Then, the conductive layer is conventionally etched back so that it remains in a predetermined (e.g., lower) portion of the trench, thereby forming a floating gate layer 204 on the tunneling oxide layer 203. At this time, after the etch-back process, the trench T1 has a sufficient space for a control gate.

Figure 3D:
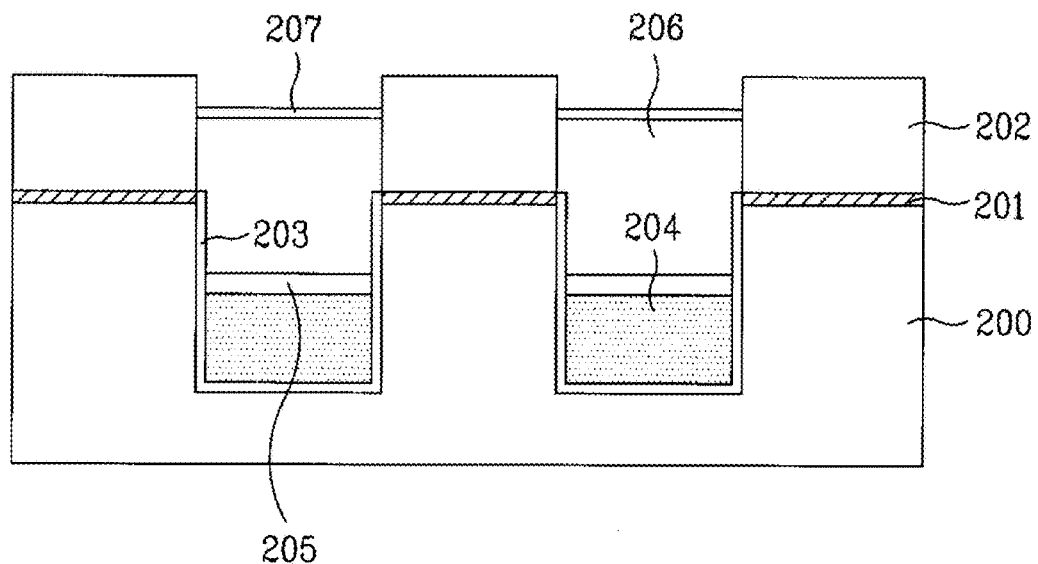

As shown in FIG. 3D, a dielectric layer 205 is formed on an upper surface of the floating gate layer 204. The dielectric layer 205 comprises an oxide layer (e.g., silicon dioxide) and may be formed by a CVD process or a thermal oxidation process. As shown in FIG. 3D, dielectric layer 205 is formed by thermal oxidation. Then, a conductive layer is deposited on the entire surface of the semiconductor substrate 200. The conductive layer is etched back so that it remains in the trench, whereby a control gate layer 206 is formed on the dielectric layer 205. Control gate layer 206 generally comprises polysilicon (which may be further doped with one or more conventional silicon dopants and/or which may further contain a conventional metal silicide). After that, an upper surface of the control gate layer 206 may be conventionally oxidized to form an oxide layer 207.

Figure 3E:
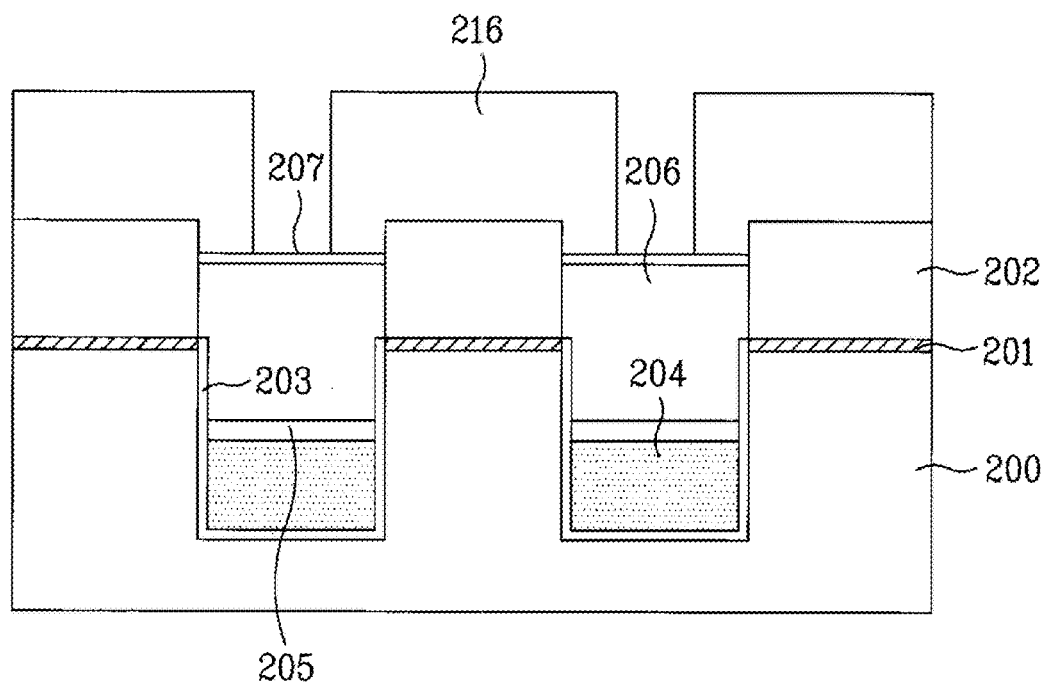

As shown in FIG. 3E, a second photoresist layer 216 is formed on the entire surface of the semiconductor substrate 200 including the oxide layer 207, and then the second photoresist 216 is patterned to expose a central portion of the trench T1 by a conventional photolithography (e.g., exposure and development) process. Generally, the patterned second photoresist 216 covers a sufficient width and/or length of an outer or peripheral portion of the underlying oxide layer 207 to enable subsequent formation of an electrode or contact to the control gate layer 206 (e.g., after formation of the cell is substantially complete and/or during formation of an electrode or contact to the drain junctions).

Figure 3F:
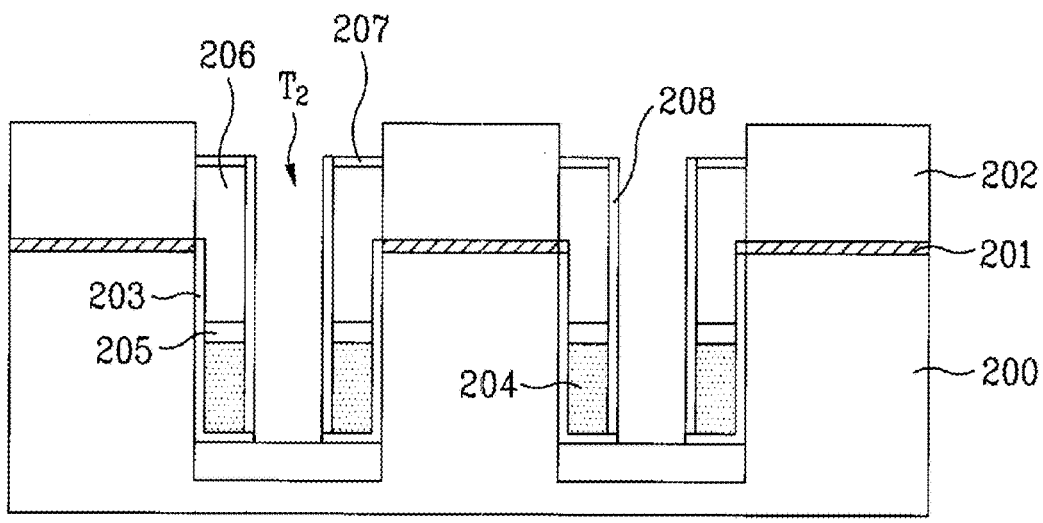

Referring to FIG. 3F, the oxide layer 207, the control gate layer 206, the dielectric layer 205, the floating gate layer 204 and the tunneling oxide layer 203 (corresponding to the central portion of the trench T1) are etched using the patterned second photoresist 216 as a mask, thereby forming a second trench T2. The bottom surface of second trench T2 is substantially coplanar with the bottom surface of first trench T1. Then, the semiconductor substrate 200 may be conventionally cleaned. Subsequently, a buffer dielectric layer 208 (generally comprising or consisting essentially of silicon dioxide) is formed on inner surfaces of the cleaned second trench T2 (generally by CVD or conventional oxidation), and then a predetermined portion of the buffer dielectric layer 208, corresponding to the bottom surface of the second trench T2, is removed by the etch-back process (e.g., anisotropic etching). When formed by oxidation, the buffer dielectric layer 208 is generally on only the control gate layer 206 and the floating gate layer 204, but when formed by CVD, the buffer dielectric layer 208 may be on (or laterally adjacent to) the control gate layer 206, the dielectric layer 205, and the floating gate layer 204 (and in most cases the tunneling oxide layer 203).

Then, impurity ions are implanted into the semiconductor substrate 200 below the second trench T2 (e.g., by straight and/or angled implantation) and conventionally diffused (e.g., by annealing), thereby forming a source junction 209. Then, the second photoresist 216 is removed. Alternatively, the second photoresist 216 may be removed before forming the source junction 209. In a preferred embodiment, at least two different impurity ions (generally having the same conductivity type) may be implanted for formation of the source junction 209. For example, phosphorous ($P^+$) and arsenic ($As^+$) impurity ions may be implanted at dosages of $10^{14}$ atoms/cm$^2$ to $10^{15}$ atoms/cm$^2$, and then the implanted impurity ions are diffused by a thermal process (e.g., annealing). Accordingly, phosphorous impurity ions may be relatively widely diffused (e.g., for effective overlap with floating gates 204), and arsenic impurity ions may be relatively narrowly diffused (e.g., to decrease a contact resistance of a subsequently formed source contact/electrode).

Figure 3G:
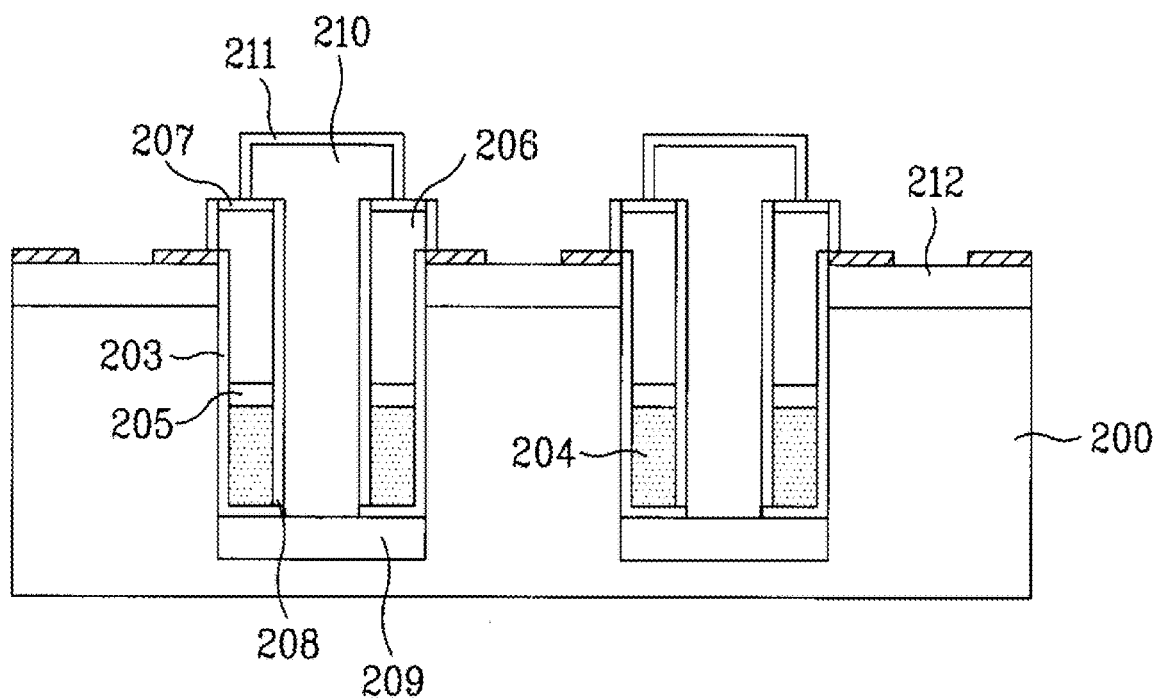

As shown in FIG. 3G, a conductive layer (e.g., comprising polysilicon [which may be further doped with one or more conventional silicon dopants] and/or a conventional metal silicide) is deposited in an amount or to a thickness sufficient to fill the second trench T2, and then the conductive layer is selectively removed (e.g., by conventional photolithography or chemical mechanical polishing), thereby forming a source electrode layer 210. In FIG. 3G, portions of the conductive layer have been selectively removed by photolithography. Then, the surface of the source electrode layer 210 is thermally oxidized, thereby forming an oxide layer 211. Alternatively, other conductors, such as conventional tungsten contacts (generally formed by CVD) or sputtered aluminum (generally following conventional formation of an adhesive and/or barrier liner [e.g., comprising a conventional Ti/TiN bilayer]), may also be suitable for the source electrode layer 210, but in such cases, formation of oxide layer 211 may not necessary take place. After removing the insulating layer 202, impurity ions are implanted into the semiconductor substrate 200 (e.g., in areas or regions from which the insulating layer 202 has been removed), and then the implanted impurity ions are diffused, thereby forming drain junctions 212. The drain junction 212 may be formed in the same process as that of the source junction 209. Although not shown, following a process of forming a drain electrode layer to the drain junction 212 (e.g., by conventional CMOS processes for forming contacts to source/drain terminals), the memory device is substantially complete.

Accordingly, the control gate and the floating gate of the split gate flash EEPROM cell are formed in a vertical structure, and two EEPROM cells may be formed in one trench, whereby it is possible to reduce or minimize the size of the cell.

However, in the first embodiment of the present invention, the control gate 206 and the floating gate layer 204 have a relatively minimal overlap in a channel region between the source junction 209 and the drain junction 212. As a result, the erase characteristics of the cell may be less than optimal. Accordingly, a second embodiment of the present invention for improving the erase characteristics of the cell will be described as follows.

FIG. 4A to FIG. 4G are cross-sectional views of an exemplary process for fabricating a split gate (flash) EEPROM cell according to a second embodiment of the present invention.

Figure 4A:
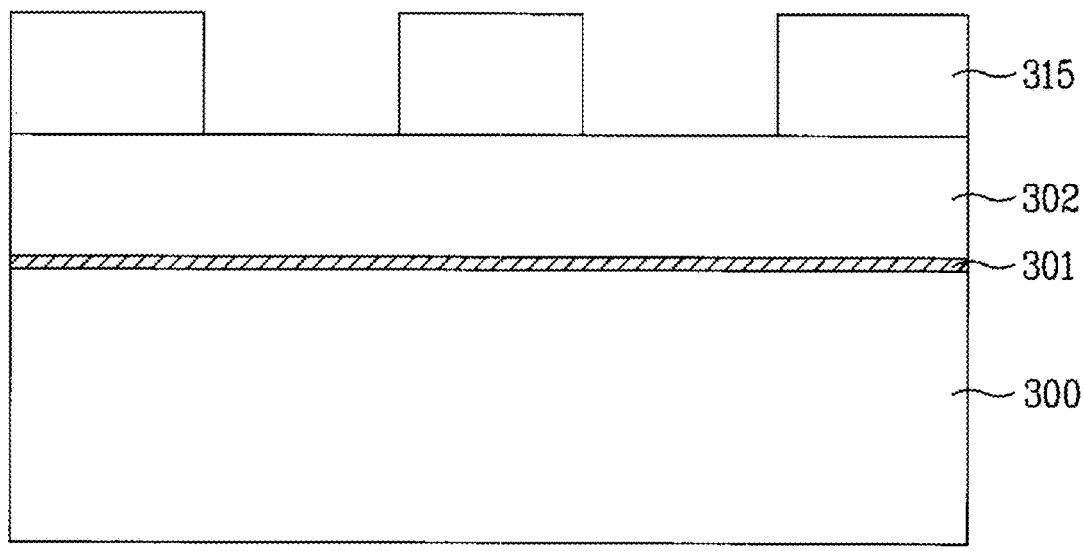
FIG. 4A to FIG. 4H are cross-sectional views of an exemplary process for manufacturing a split gate (flash) EEPROM cell according to a second embodiment of the present invention.

As shown in FIG. 4A, a semiconductor substrate 300 generally contains an active area and a field area, defined at least in part by a device isolation layer (not shown). In this state, a buffer oxide layer 301 and an insulating layer 302 are sequentially deposited on the semiconductor substrate 300. Then, a first photoresist 315 is coated on the insulating layer 302, and the first photoresist 315 is patterned by a conventional photolithography (e.g., exposure and development) process. As for insulating layer 202 (e.g., FIG. 3A), the insulating layer 302 may comprise a nitride layer.

Figure 4B:
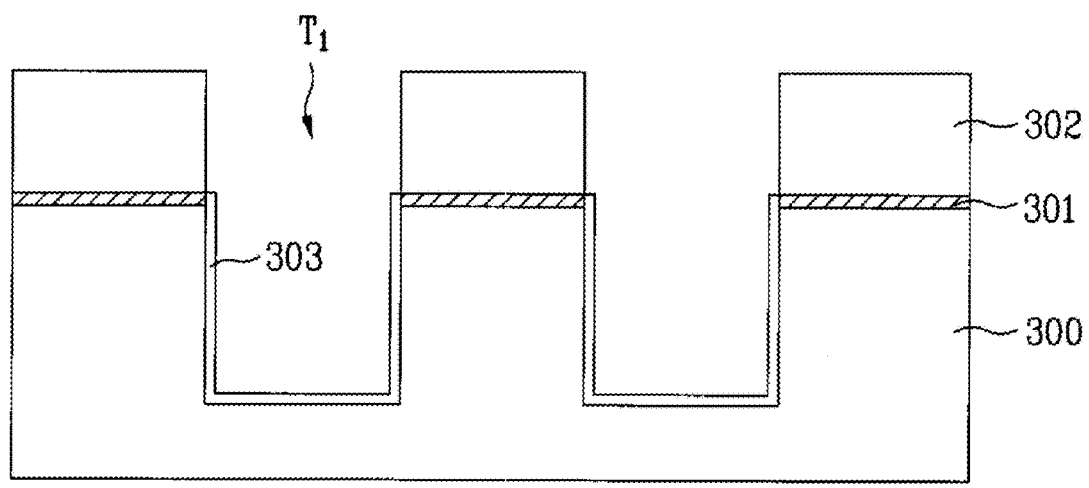

Referring to FIG. 4B, the insulating layer 302, the buffer oxide layer 301 and the semiconductor substrate 300 are etched to a predetermined depth by using the patterned first photoresist 315 as a mask, thereby forming a trench T1 in a cell region. Then, the semiconductor substrate 300 may be etched and/or cleaned by a clean active pit reactive ion etching method. After that, a tunneling oxide layer 303 is formed in the trench T1 of the semiconductor substrate 300 in a manner similar to tunneling oxide layer 203 (e.g., FIG. 3B), and the first photoresist 315 is removed.

Thus, the tunneling oxide layer 303 may be formed by a CVD process or a thermal oxidation process. In the case of the CVD process, the tunneling oxide layer 302 is generally formed on an entire surface of the semiconductor substrate 300, including the insulating layer 302. In the case of thermal oxidation, the tunneling oxide layer 302 is formed generally only on the semiconductor substrate 300 inside the trench T1. In FIG. 4B, the tunneling oxide layer 303 is formed by thermal oxidation.

Figure 4C:
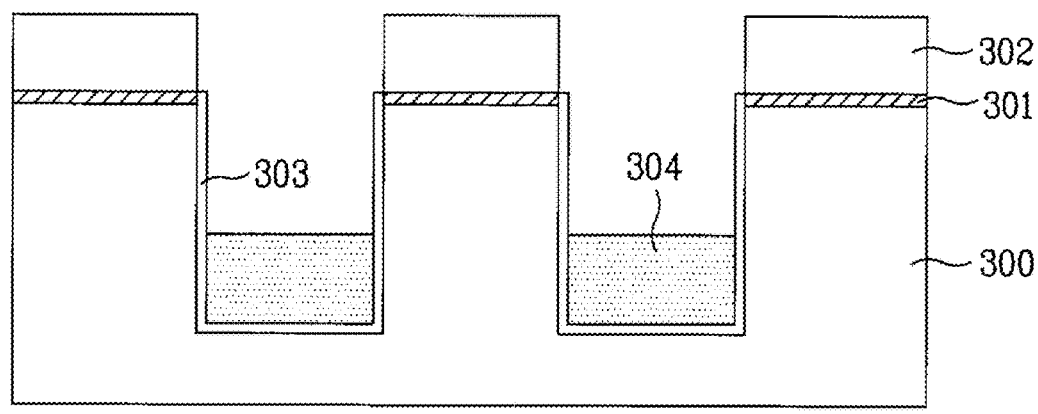

As shown in FIG. 4C, a conductive layer is deposited on the entire surface of the semiconductor substrate 300, including in the trench T1. Then, the conductive layer is etched back to remain in a predetermined (e.g., lower) portion of the trench T1, thereby forming a floating gate layer 304 on the tunneling oxide layer 303. At this time, after the etch-back process, the trench T1 has a sufficient space for a control gate.

Figure 4D:
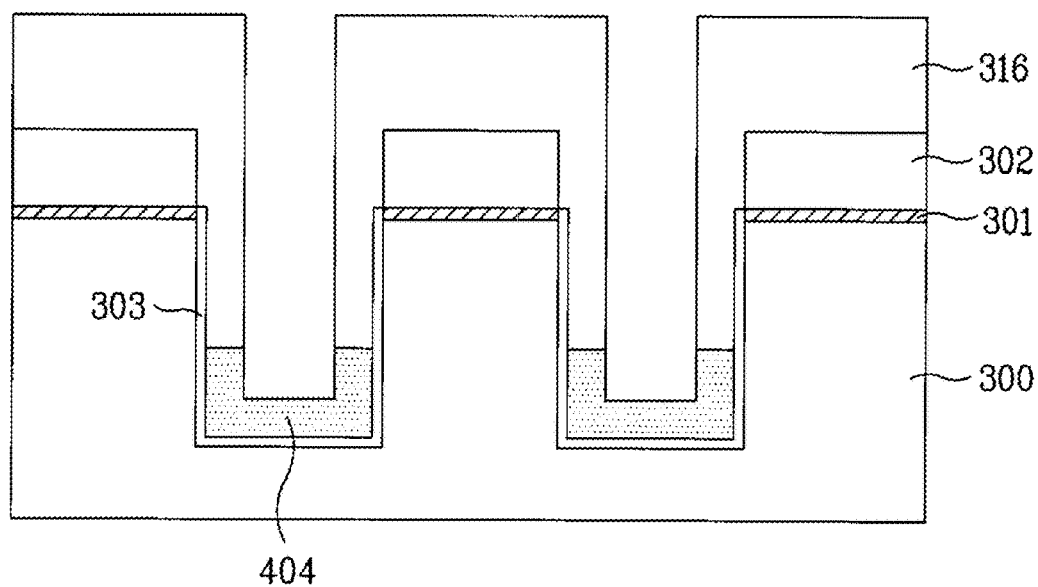

As shown in FIG. 4D, a second photoresist 316 is deposited on the entire surface of the semiconductor substrate 300, including the floating gate layer 304. Then, the second photoresist 316 is patterned to expose a central portion of the floating gate layer 304 by an exposure and development process. Then, the floating gate layer 304 is partially etched to a predetermined depth (e.g., a vertical overlap depth) using the patterned second photoresist 316 as a mask, and the second photoresist 316 is removed. Given a known etch rate for the material of the floating gate layer 304 under known etch conditions, the predetermined depth of etching the floating gate layer 304 may be determined and/or controlled by a timed etch (e.g., etching for a predetermined period of time).

Figure 4E:
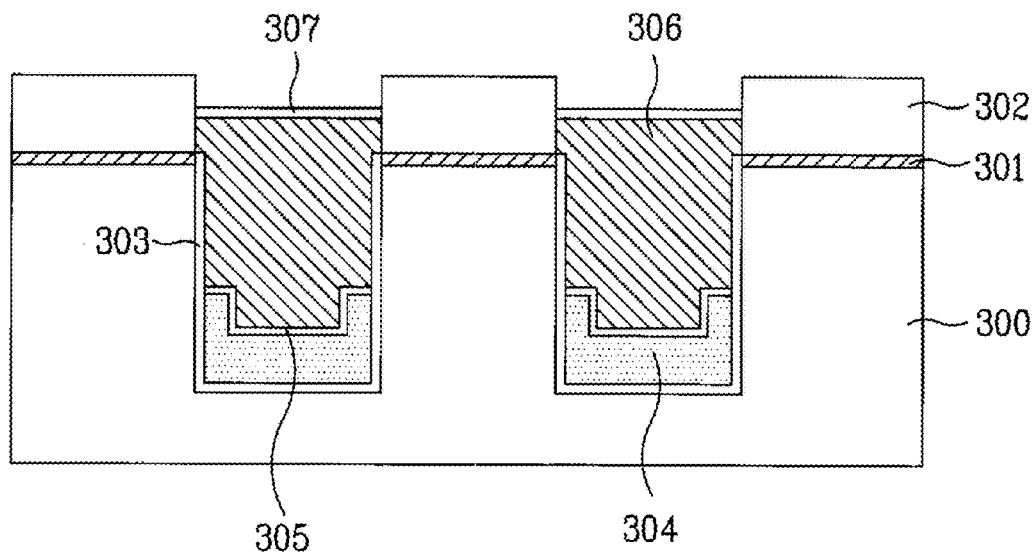

Referring to FIG. 4E, a dielectric layer 305 is formed on an upper surface of the floating gate layer 304. The dielectric layer 305 generally comprises an oxide layer formed by a CVD process or a thermal oxidation process. Then, a conductive layer similar to the conductive layer 206 (FIG. 3D) is deposited on the entire surface of the semiconductor substrate 300. The conductive layer is also etched back so that it remains in the trench, whereby a control gate layer 306 is formed on the dielectric layer 305. After that, an upper surface of the control gate layer 306 is oxidized to form an oxide layer 307.

Figure 4F:
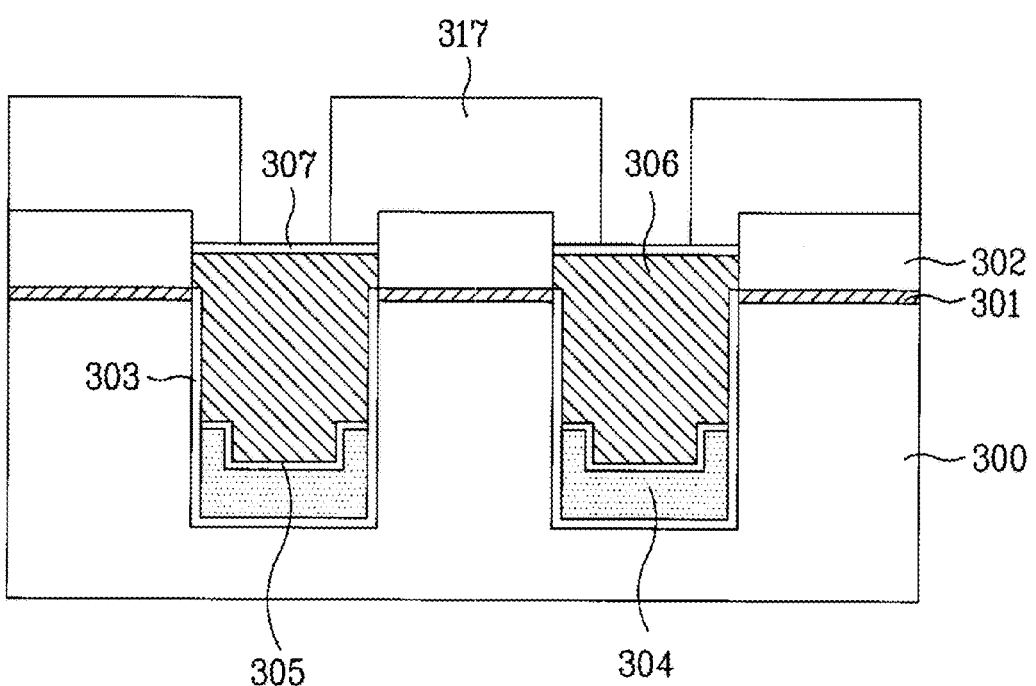

As shown in FIG. 4F, a third photoresist 317 is formed on the entire surface of the semiconductor substrate 300 including the oxide layer 307, and then the third photoresist 316 is patterned to expose a central portion of the trench T1 by an exposure and development process. Generally, the patterned third photoresist 317 has dimensions substantially similar or equivalent to those of patterned second photoresist 216 (FIG. 3E), but exposing a smaller portion of oxide layer 307 along its length and/or width than the central portion of the floating gate layer 304 exposed by the second photoresist 316 (FIG. 4D). FIG. 4F shows an opening in the patterned third photoresist 317 having a width less than that of a corresponding opening in the second photoresist 316.

Figure 4G:
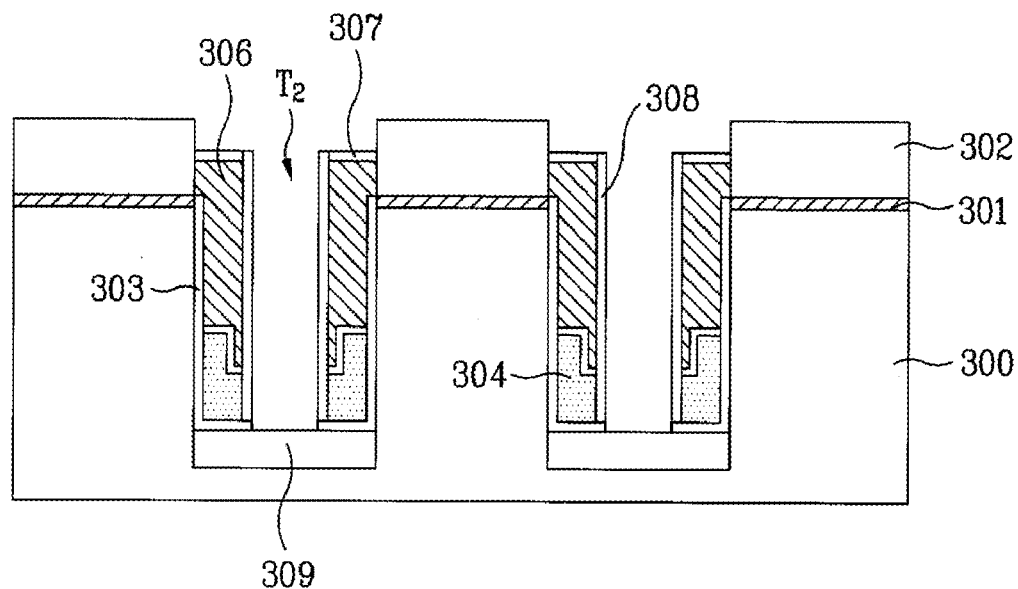

Referring to FIG. 4G, portions of the oxide layer 307, the control gate layer 306, the dielectric layer 305, the floating gate layer 304 and the tunneling oxide layer 303 corresponding to the central portion of the trench T1 are etched by using the patterned third photoresist 317 as a mask, thereby forming a second trench T2. Then, the semiconductor substrate 300 may be cleaned. Subsequently, a buffer dielectric layer 308 is formed in the cleaned second trench T2, and a predetermined portion of the buffer dielectric layer 308, corresponding to the bottom surface of the second trench T2, is removed by an etch-back (e.g., anisotropic etching) process.

Then, impurity ions are implanted into and diffused in the semiconductor substrate 300 below the second trench T2 similar to the process for source junction 209 (FIG. 3F), thereby forming a source junction 309. The third photoresist 317 may be removed, either before or (preferably) after ion implantation to form the source junction 309. For formation of the source junction 309, in one embodiment, at least two impurity ions are implanted. As for source junction 209, phosphorous and arsenic impurity ions may be implanted at dosages of from $10^{14}$ atoms/cm$^2$ to $10^{15}$ atoms/cm$^2$, and then the implanted impurity ions may be diffused by a thermal process. Accordingly, phosphorous impurity ions may be widely diffused, and arsenic impurity ions may decrease a contact resistance.

Figure 4H:
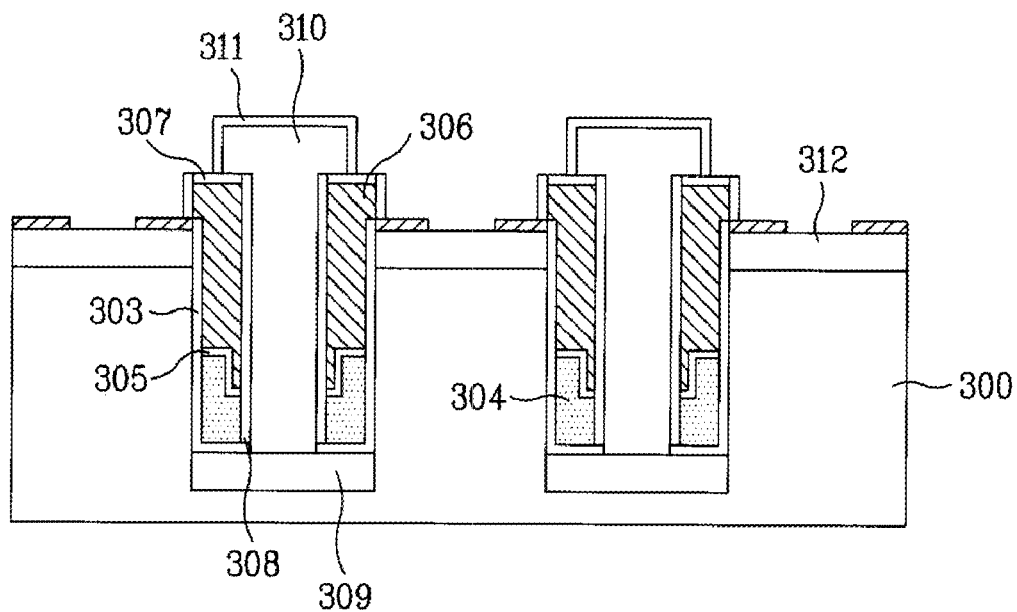

As shown in FIG. 4H, a conductive layer is deposited sufficiently to fill the second trench T2, and then the conductive layer is selectively removed by photolithography or CMP (preferably, photolithography), thereby forming a source electrode layer 310. Then, the surface of the source electrode layer 310 may be thermally oxidized, thereby forming an oxide layer 311. After removing the insulating layer 302, impurity ions are implanted into the semiconductor substrate 300 (e.g., in areas from which the insulating layer 302 is removed), and then the implanted impurity ions are diffused, thereby forming a drain junction 312. The drain junction 312 may be formed in the same process as that of the source junction 309. Although not shown, following the process of forming a drain electrode layer to the drain junction 312, the memory device is substantially complete.

In the memory device according to the second embodiment of the present invention, as shown in FIG. 4H, the control gate layer 306 and the floating gate layer 304 overlap vertically and horizontally in a channel region between the source junction 309 and the drain junction 312, thereby improving the erase characteristics of the cell.

As mentioned above, the memory device and the method for manufacturing the same have the following advantages.

First, the control gate and the floating gate of the split gate cell are formed in a vertical structure, whereby it is possible to reduce or minimize the cell size, and to improve device integration. Also, it is possible to obtain a high coupling ratio, thereby lowering the programming voltage.

In addition, the control gate and the floating gate of the split gate cell may overlap vertically and horizontally in the channel region between the source junction and the drain junction, thereby improving the cell erase characteristics.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for manufacturing a memory device comprising:
   depositing an insulating layer on a semiconductor substrate;
   forming a first trench in the semiconductor substrate by etching the insulating layer and the semiconductor substrate to a predetermined depth;
   forming a tunneling oxide layer in the first trench;
   forming a floating gate layer on the tunneling oxide layer inside the first trench;
   forming a dielectric layer on the floating gate layer;
   forming a control gate layer in the first trench on the dielectric layer;
   forming an oxide layer on the control gate layer;
   forming a second trench by removing central portions of the oxide layer, the control gate layer, the dielectric layer, the floating gate layer and the tunneling oxide layer in the first trench;
   forming a buffer dielectric layer on a sidewall of the second trench;
   forming a source junction by implanting impurity ions into the semiconductor substrate below the second trench;
   forming a source electrode in the second trench, electrically connected to the source junction; and forming a drain junction by implanting impurity ions into exposed areas of the semiconductor substrate.

2. The method of claim 1, further comprising:
forming a buffer oxide layer on the semiconductor substrate before depositing the insulating layer.

3. The method of claim 1, wherein forming the source junction comprises implanting first and second impurity ions having the same conductive type.

4. The method of claim 3, wherein forming the drain junction comprises implanting said first and second impurity ions having the same conductive type.

5. The method of claim 1, wherein forming the tunneling oxide layer comprises a CVD process or a thermal oxidation process.

6. The method of claim 1, further comprising:
removing a central portion of the floating gate layer to a predetermined depth, prior to forming the dielectric layer.

7. A method for manufacturing a memory device comprising:
forming a tunneling oxide layer in a first trench in a semiconductor substrate;
forming a floating gate layer on the tunneling oxide layer in the first trench;
removing a central portion of the floating gate layer to a predetermined depth to form an indentation prior to forming the dielectric layer,
forming a dielectric layer on the floating gate layer;
forming a control gate layer in the first trench on the dielectric layer, including a protrusion of the control gate layer within the indentation of the floating gate layer so that the floating gate layer overlaps vertically with the control gate layer;
forming a second trench by removing central portions of the control gate layer, the dielectric layer, the floating gate layer and the tunneling oxide layer in the first trench;
forming a buffer dielectric layer on a sidewall of the second trench;
forming a source junction by implanting impurity ions into the semiconductor substrate below the second trench;
forming a source electrode in the second trench, electrically connected to the source junction; and
forming a drain junction by implanting impurity ions into exposed areas of the semiconductor substrate.

* * * * *